(12) United States Patent
Higuchi et al.

(10) Patent No.: US 8,866,183 B2
(45) Date of Patent: Oct. 21, 2014

(54) LED MODULE

(75) Inventors: Sachio Higuchi, Hyougo (JP); Takashi Tanaka, Aichi (JP); Mitunori Mizoguti, Aichi (JP); Tsuyoshi Inui, Aichi (JP); Atsuo Fukuda, Aichi (JP)

(73) Assignee: Panasonic Industrial Devices Sunx Co., Ltd., Aichi (JP)

( * ) Notice: Subject to any disclaimer, the term of this patent is extended or adjusted under 35 U.S.C. 154(b) by 0 days.

(21) Appl. No.: 13/822,454

(22) PCT Filed: Sep. 26, 2011

(86) PCT No.: PCT/IB2011/002224
§ 371 (c)(1),
(2), (4) Date: Mar. 12, 2013

(87) PCT Pub. No.: WO2012/042333
PCT Pub. Date: Apr. 5, 2012

(65) Prior Publication Data
US 2013/0181251 A1    Jul. 18, 2013

(30) Foreign Application Priority Data

Sep. 27, 2010 (JP) ................. 2010-216213

(51) Int. Cl.
| | | |
|---|---|---|
| *H01L 33/00* | (2010.01) | |
| *H01L 33/64* | (2010.01) | |
| *H01L 33/48* | (2010.01) | |
| *H01L 33/62* | (2010.01) | |

(52) U.S. Cl.
CPC ....... *H01L 33/64* (2013.01); *H01L 2224/48227* (2013.01); *H01L 33/642* (2013.01); *H01L 2224/32225* (2013.01); *H01L 33/62* (2013.01); *H01L 33/486* (2013.01); *H01L 2224/73265* (2013.01)
USPC 257/99; 257/706; 257/E33.075; 257/E23.08; 257/E23.101; 257/E21.51

(58) Field of Classification Search
USPC .............. 257/99, 706, 712, E33.075, E23.08, 257/E23.101, E21.51, E23.011
See application file for complete search history.

(56) References Cited

U.S. PATENT DOCUMENTS

2009/0026472 A1    1/2009   Yasuda et al.

FOREIGN PATENT DOCUMENTS

| JP | 2006-60058 | 3/2006 |
|---|---|---|
| JP | 2006-100687 | 4/2006 |
| JP | 2006-303191 | 11/2006 |
| JP | 2006-303373 | 11/2006 |
| JP | 2006-303396 | 11/2006 |
| JP | 2008-34530 | 2/2008 |
| JP | 2009-130204 | 6/2009 |
| JP | 2009-212367 | 9/2009 |
| JP | 2010-171217 | 8/2010 |

OTHER PUBLICATIONS

International Search Report dated Dec. 13, 2011.

*Primary Examiner* — Thien F Tran
(74) *Attorney, Agent, or Firm* — Greenblum & Bernstein, P.L.C.

(57) ABSTRACT

An LED module includes: a package having electrodes provided on the outer surface of opposing sidewalls, and a light-emitting element connected to the electrodes and mounted on the package; a base member having a copper metal; an insulating layer stacked on the surface of the base member and having an insulating material; and a conductive wiring pattern connected to the electrodes by soldering and formed on the surface of the insulating layer. The insulating layer has a through-hole formed by removing a part of the section where the package is positioned, and a heat dissipation unit formed by soldering between the back surface of the package and the base member, which face one another with the through-hole interposed therebetween.

3 Claims, 5 Drawing Sheets

LED MODULE

FIELD OF THE INVENTION

The present invention relates to an LED module in which an LED chip is mounted within a package.

BACKGROUND OF THE INVENTION

Conventionally, there have been available light source devices in which a discharge lamp, a laser oscillator, or the like have been used as a light source. In recent years, a variety of light source devices employing an LED (Light Emitting Diode) module as a light source has been proposed in an effort to seek reduced power consumption and prolonged lifespan. For example, an LED module whose emission wavelength is set to fall within an ultraviolet region is used as an ultraviolet irradiation source in an ultraviolet irradiation device for irradiating ultraviolet rays on an ultraviolet curable resin such as paint, an adhesive agent, a pigment, or the like to thereby cure and dry the ultraviolet curable resin.

In the LED module for use in this kind of light source device, an LED chip is mounted within a package. The LED module is manufactured by arranging a plurality of packages side by side so as to obtain a desired light quantity. An LED chip with high output power is used as the LED chip. The LED chip is set so as to obtain a desired light quantity.

If the LED chip emits a light by supplying an electric current to the LED module, the LED chip generates heat. As stated above, the LED module of this kind makes use of a plurality of LED chips. Therefore, the LED module generates an increased amount of heat. The emission efficiency of the LED chip has a negative temperature coefficient. This poses a problem in that, if the amount of heat generated by the LED chip becomes larger, the emission efficiency of the LED module gets lower.

Just like an LED mounting structure as disclosed in, e.g., JP2006-100687A, there are proposed an LED module with an enhanced heat dissipation effect and a mounting structure thereof. In the LED mounting structure disclosed in JP2006-100687A, a substrate is formed by stacking an insulating layer, wiring patterns, and a resist on the upper surface of a base member made of metal having high heat conductivity. A package equipped with an LED chip is mounted on the surface of the substrate. At this time, the insulating layer or the resist of the substrate positioned at the bottom surface side of the package is removed. A heat transfer member such as silicon rubber or the like is arranged between the package and the base member. As a result, the heat generated from the LED chip is dissipated via the heat transfer member and the base member, thereby enhancing the heat dissipation effect.

In order to manufacture the LED module disclosed in JP2006-100687A, however, there is a need to first stack the insulating layer, the wiring patterns, and the resist on the base member and then secondly, to remove the insulating layer, the wiring patterns, and the resist from the region over which the package is to be mounted. The heat transfer member is arranged in the region from which the insulating layer, the wiring patterns, and the resist are removed. The package equipped with the LED chip is arranged on the heat transfer member. Electrodes arranged in the package are soldered to the wiring patterns. The manufacturing process of the LED module disclosed in JP2006-100687A is too complex.

SUMMARY OF THE INVENTION

In view of the above, the present invention provides an LED module capable of reliably dissipating heat generated from an LED chip and simplifying a manufacturing process thereof.

In accordance with an embodiment of the present invention, there is provided an LED module including: a package including electrodes formed on outer surfaces of opposite sidewalls of the package and a light emitting element mounted in the package and connected to the electrodes; a base member made of copper-based metal; an insulating layer made of an insulating material and stacked on a surface of the base member; and an electrically conductive wiring pattern formed on a surface of the insulating layer and soldered to the electrodes.

The insulating layer includes a through portion formed by partially removing a region of the insulating layer in which the package is to be arranged, and a heat dissipation member made of a solder is arranged between a bottom surface of the package and the base member opposite to each other through the through portion.

In the LED module, a metal-made heat dissipation layer may preferably be provided on the bottom surface of the package.

With the LED module in accordance with the embodiment of the present invention, it becomes unnecessary to use a step for arranging a heat transfer member in a region from which an insulating layer or the like is removed. It is also possible to reliably dissipate the heat generated from the light emitting element and to simplify the manufacturing process.

BRIEF DESCRIPTION OF THE DRAWINGS

The objects and features of the present invention will become apparent from the following description of a preferred embodiment given in conjunction with the accompanying drawings.

DETAILED DESCRIPTION OF THE EMBODIMENTS

An embodiment of the present invention will now be described in detail with reference to the accompanying drawings which form a part of the subject specification. Throughout the drawings, identical or similar portions will be designated by like reference symbols without redundant description thereof.

An LED module in accordance with the embodiment of the present invention is described with reference to the drawings.

The LED module 1 in accordance with the present embodiment is used as an ultraviolet irradiation source in an ultraviolet irradiation device for irradiating ultraviolet rays on an ultraviolet curable resin such as paint, an adhesive agent, or a pigment to thereby cure and dry the ultraviolet curable resin. In the following description, unless otherwise stated, the up-down direction in FIG. 2A will be defined as the front-back direction of the LED module 1. The left-right direction in FIG. 2A will be defined as the left-right direction of the LED module 1. The up-down direction in FIG. 1 will be defined as the up-down direction of the LED module 1.

Figure 1:
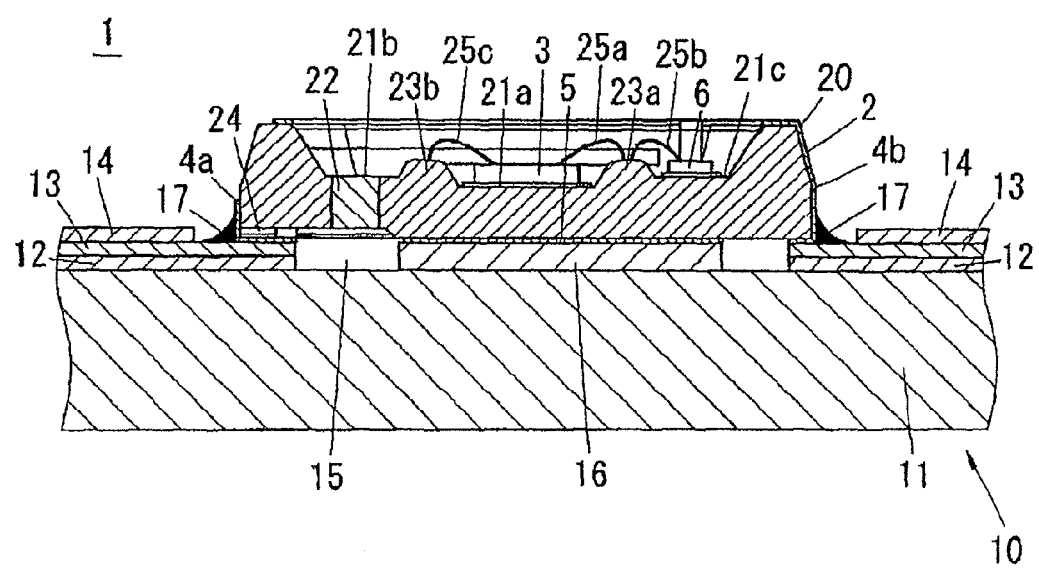
FIG. 1 is a schematic section view showing certain major portions of an LED module in accordance with the present embodiment.
Figure 2A:
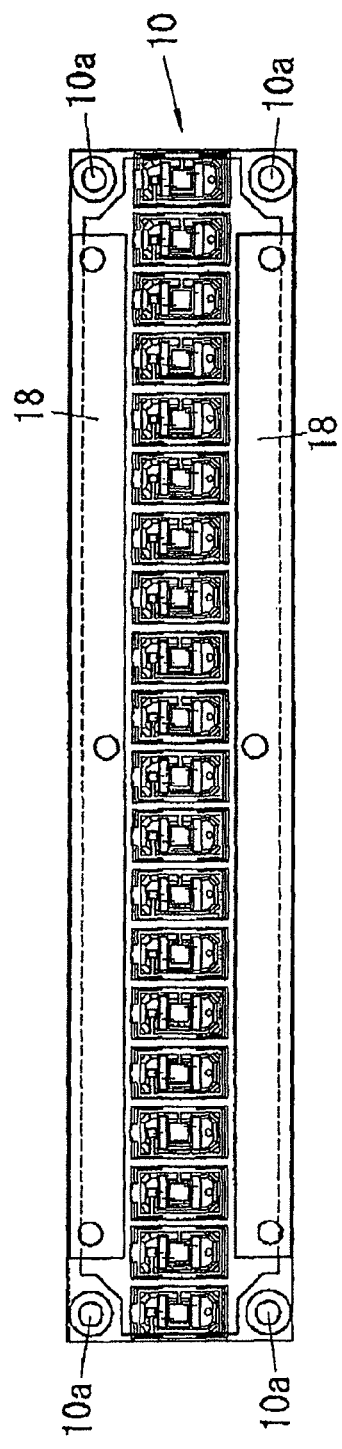
FIGS. 2A through 2D show a substrate configuring the LED module in accordance with the present embodiment, FIG. 2A showing a plane view for explaining a substrate as a whole, FIG. 2B showing a plane view for explaining wiring patterns, FIG. 2C showing a plane view for explaining a resist layer, and FIG. 2D showing a plane view for explaining a through-hole.

As shown in FIGS. 1 and 2A, the LED module 1 includes a substrate 10 of a rectangular flat plate whose left-right direction extends in the longitudinal direction and a plurality of packages 2 arranged side by side along the left-right direction on the upper surface of the substrate 10. In an ultraviolet irradiation device, a plurality of LED modules 1 is arranged side by side along the left-right direction and the front-back direction so as to irradiate a specified region with a desired quantity of light.

As shown in FIGS. 3A through 3D, each of the packages 2 includes an LED chip 3, an over-voltage-preventing zener diode chip 6 for limiting a voltage applied to the LED chip 3, and a package body 20 having a recess portion 21 formed on the surface thereof, the LED chip 3 and the zener diode chip 6 being arranged within the recess portion 21 of the package body 20.

The package body 20 is made of a ceramic material with high heat-dissipating property, e.g., alumina, aluminum nitride or the like, and is formed of an injection-molded product of a substantially rectangular parallelepiped shape whose longitudinal direction extends in the front-back direction. Conductive patterns 26 and 27 and electrode pads 4a and 4b are patterned on the surface of the package body 20 through the use of, e.g., a MID (Molded Interconnect Device: three-dimensional injection-molded circuit part) technique.

An elongated recess portion 21 whose long side extends in the front-back direction when seen from a top view is formed on the surface (the upper surface in FIG. 3D) of the package body 20. The LED chip 3 is arranged on the bottom of the recess portion 21 in the left-right and front-back central position of the package body 20. The zener diode chip 6 is arranged on the bottom of the recess portion 21 at one front-back-direction side (e.g., the front side) of the LED chip 3. A through-hole 22 to be later described is formed at the other front-back-direction side (the back side) of the LED chip 3.

On the bottom of the recess portion 21, there are provided ribs 23a and 23b that protrude toward the opening side (upper side) of the recess portion 21 from the region between the LED chip 3 and the zener diode chip 6 and the region between the LED chip 3 and the through-hole 22. Within the recess portion 21 of the package body 20, the LED chip 3, the zener diode chip 6, and the through-hole 22 are arranged side by side along the front-back direction where they are isolated by the ribs 23a and 23b. The top surfaces of the ribs 23a and 23b are positioned above the top surface of the LED chip 3 mounted in a recess portion 21a.

A frame-shaped conductive pattern 26 extends over the entire periphery of the recess portion 21 on the surface of the package body 20. The conductive pattern 26 is provided in a continuous relationship with die pad portions 50 and 52 formed in the recess portions 21a and 21c and is electrically connected to lower electrodes (not shown) of the LED chip 3 and the zener diode chip 6. An electrode pad 4b extending from the conductive pattern 26 toward the bottom surface of the package body 20 is formed on one end surface in the longitudinal direction (e.g., the front end surface) of the package body 20.

A depressed portion 24 extending from the back end of the package body 20 beyond the through-hole 22 is provided on the bottom surface (the lower surface in FIG. 3D) of the package body 20. On the bottom surface of the package body 20, a step portion is provided between the depressed portion 24 and the remaining region of the bottom surface of the package body 20. The bottom surface of the depressed portion 24 is positioned above the bottom surface of the package body 20 other than the depressed portion 24. The inner circumferential surface of the through-hole 22 opened into the depressed portion 24 is plated with metal and is electrically connected to an electrode pad 4a formed on the opposite end surface (e.g., on the bottom end surface of the package body 20) of the package body 20 from the end surface on which the electrode pad 4b is formed.

A conductive pattern 27 electrically connected to the through-hole 22 is formed in the substantially entire region of the recess portion 21b of the package body 20. Bonding pads 28a and 28b formed on the ribs 23a and 23b are provided in a continuous relationship with the conductive pattern 27. The bonding pad 28a is connected via bonding wires (thin metallic wires) 25a and 25b to an upper electrode (e.g., a cathode electrode) of the LED chip 3 and an upper electrode of the zener diode chip 6. Similarly, the bonding pad 28b is connected via a bonding wire (a thin metallic wire) 25c to the upper electrode of the LED chip 3.

A junction pad 5 plated into a rectangular plate shape is provided in the left-right central region of the bottom surface of the package body 20.

As set forth above, in each of the packages 2, the electrode pads 4a and 4b provided at the front and back side walls of the package body 20, the LED chip 3 and the zener diode chip 6 are electrically connected to one another. Therefore, if an electric current is supplied to between the electrode pads 4a and 4b, the LED chip 3 emits and irradiates ultraviolet rays.

The substrate 10 is formed by stacking an insulating layer 12, wiring patterns 13, and a resist layer 14 on the upper surface of a base member 11 made of copper-based metal with high conductivity. Screw holes 10a for use in attaching the substrate 10 to the ultraviolet irradiation device are formed in four corners of the substrate 10.

Current reinforcing bars 18, which is formed into a rectangular plate shape with its longitudinal direction extending in the left-right direction and made of highly conductive metal such as copper or the like, are attached to the upper surface of the substrate 10 at the front and back edge portions of the substrate 10. The current reinforcing bars 18 and the packages 2 are attached to the substrate 10 by virtue of a reflow process to be described later. The current reinforcing bars 18 are electrically connected to the wiring patterns 13 of the substrate 10 so as to supply the electric power fed from the ultraviolet irradiation device to the respective packages 2 via the wiring patterns 13. At this time, the electric power having a large current value is fed from the ultraviolet irradiation device. By attaching the current reinforcing bars 18 to the substrate 10, it is possible to reduce the resistance against the electric current thus supplied. This makes it possible to supply the electric power having a large current value to the respective packages 2 with a reduced loss of electric power.

The insulating layer 12 of the substrate 10 is formed into a thin film shape (with a thickness of, e.g., about 14 μm) by a polyimide having heat resistance and an insulation property. The insulating layer 12 is attached to the surface of the base member 11 by an adhesive agent or the like so as to cover the entire region of the surface of the base member 11.

Figure 2B:
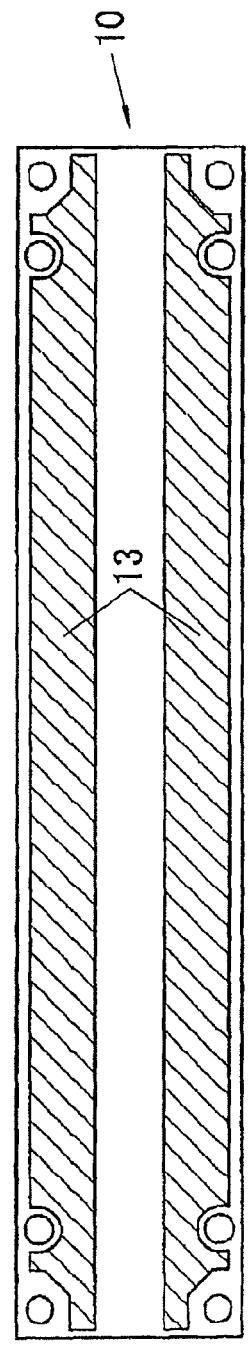

Each of the wiring patterns 13 of the substrate 10 is formed into a thin film shape (with a thickness of, e.g., about 18 μm) by a metal having increased electric conductivity. Each of the wiring patterns 13 is formed of, e.g., a copper foil. As indicated by the hatching in FIG. 2B, the wiring patterns 13 are provided in the regions of the top surface of the insulating layer 12, excluding the front-back-direction central region and the regions around the screw holes 10a. The wiring patterns 13 and the electrode pads 4a and 4b of each of the packages 2 arranged on the upper surface of the substrate 10 are connected to each other by solders 17 (see FIG. 1).

Figure 2C:
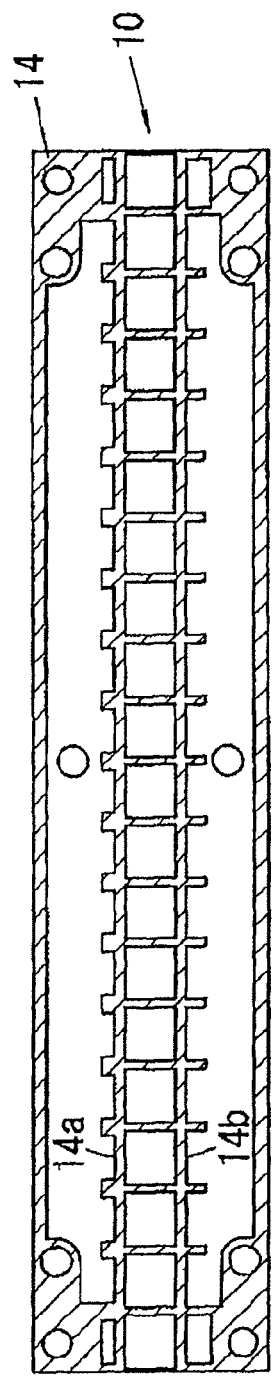

The resist layer 14 of the substrate 10 is a solder resist serving to deter adherence of solders. As indicated by the hatching in FIG. 2C, the resist layer 14 is formed in the necessary regions of central and peripheral portions in the front-back-direction of the substrate 10. The resist layer 14 includes groove portions 14a and 14b depressed toward the front-back-direction center. The groove portions 14a and 14b are arranged along the left-right direction, i.e., the arranging direction of the packages 2, in a specified interval equal to the arranging interval of the packages 2. The width of each of the groove portions 14a and 14b is set pursuant to the arrangement position and size of the electrode pads 4a and 4b of each of the packages 2.

In the present embodiment, the groove portion 14a where the electrode pad 4b is arranged is formed in the left-right-direction central position of each of the packages 2 so as to have a width smaller than the width of the groove portion 14b. The groove portion 14b where the electrode pad 4a is arranged is formed to have a dimension substantially equal to the left-right-direction dimension of each of the packages 2. This prevents the solders from being attached to between the electrode pads 4a and between the electrode pads 4b of the adjacent packages 2.

Figure 2D:
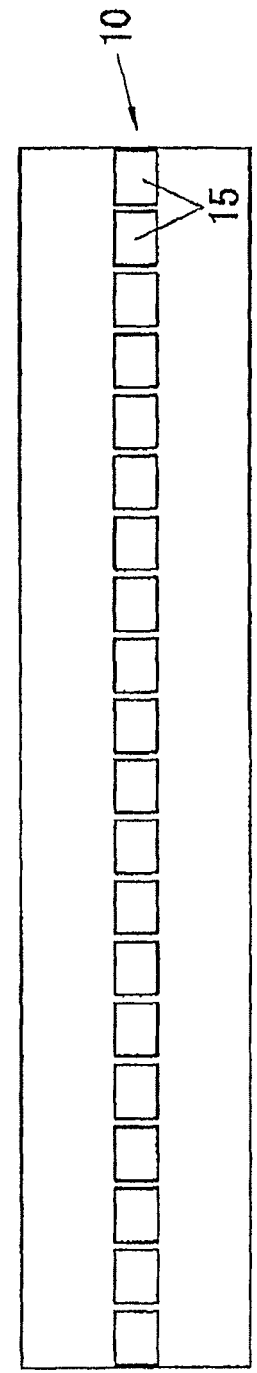
Figure 3A:
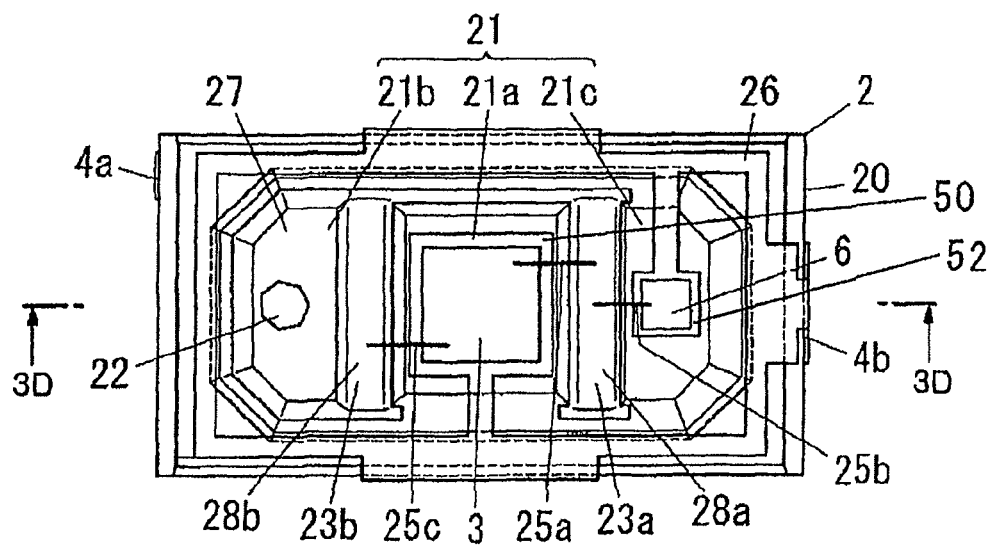
FIGS. 3A through 3D show a package configuring the LED module in accordance with the present embodiment, FIG. 3A showing a plane view of the package, FIG. 3B showing a bottom view of the package, FIG. 3C showing a side view of the package, and FIG. 3D showing a cross-sectional view taken along line 3D-3D in FIG. 3A.
Figure 3B:
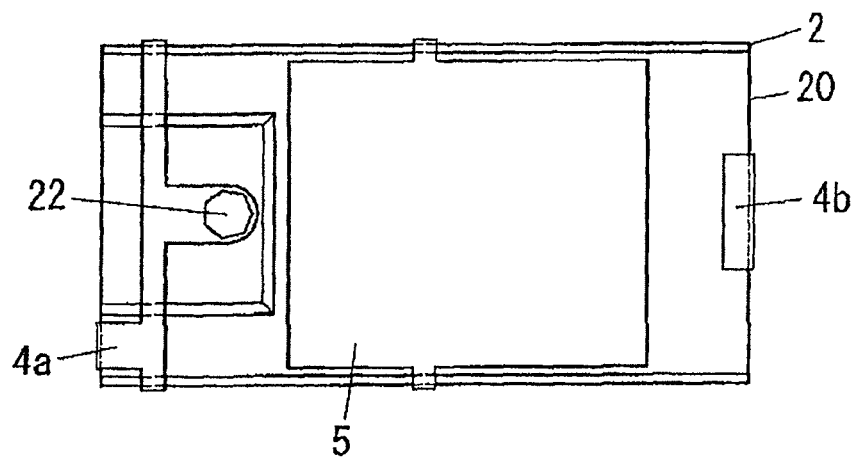
Figure 3C:
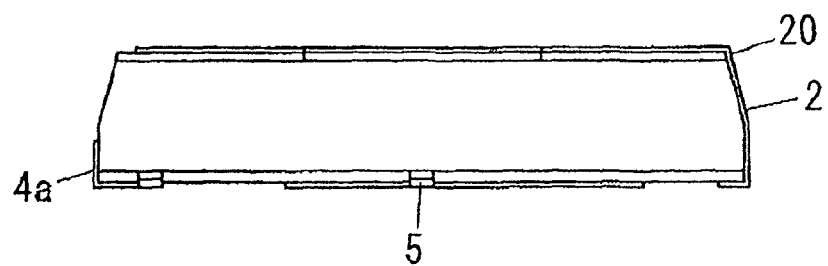
Figure 3D:
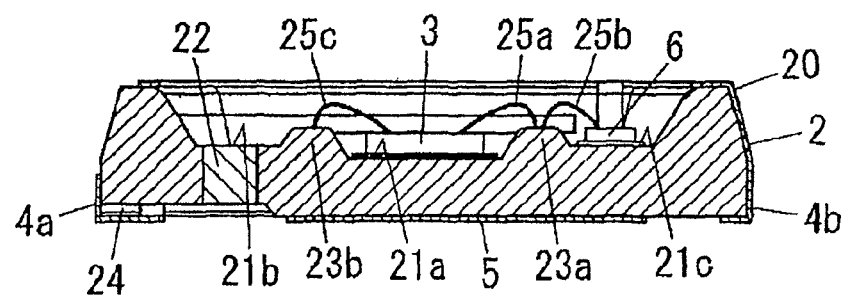

As shown in FIG. 2D, the regions of the insulating layer 12 and the resist layer 14 of the substrate 10 where the packages 2 are arranged (the substantially central regions of the substrate 10 in the front-back direction) are removed to form through portions 15. The through portions 15 are formed into such a shape that at least the front-back-direction size thereof becomes smaller than the external dimension of the packages 2 (see FIG. 1).

A solder (heat dissipation member) 16 for dissipating the heat generated from each of the packages 2 is provided in the central region of each of the through potions 15. The junction pad (heat dissipation layer) 5 arranged on the bottom surface of each of the packages 2 is thermally connected to the base member 11 through the solder 16 (see FIG. 1).

Description will now be made on a method of manufacturing the LED module 1 of the present embodiment. First of all, the insulating layer 12 is formed on the entire region of the top surface of the base member 11 made of copper-based metal. The through portions 15 are formed to penetrate the insulating layer 12. Next, the wiring patterns 13 are formed on the top surface of the insulating layer 12. The resist layer 14 is formed so as to cover the insulating layer 12 and the wiring patterns 13. Then, cream solders are formed, by screen printing or other methods, on the edges of the surfaces of the wiring patterns 13 facing the front-back-direction center of the substrate 10, on the regions of the surfaces of the wiring patterns 13 making contact with the current reinforcing bars 18 and on the surface of the base member 11 corresponding to the substantially central region of each of the through portions 15.

Thereafter, the current reinforcing bars 18 and the packages 2 are arranged on the substrate 10. The cream solders are melted by a reflow process. As a result, the packages 2 are mounted on the substrate 10. The electrode pads 4a and 4b of the packages 2 and the wiring patterns 13 of the substrate 10 are electrically connected to each other. The junction pads 5 of the packages 2 and the base member 11 of the substrate 10 are thermally connected to each other. At the same time, the current reinforcing bars 18 are mounted to the substrate 10, so that the current reinforcing bars 18 and the wiring patterns 13 are electrically connected to each other.

With the LED module 1 described above, the heat generated from the LED chip 3 of each of the packages 2 is dissipated via the solder 16 and the base member 11. This makes it possible to reliably dissipate the heat generated from the LED chip 3. The solder 16 for thermally interconnecting the junction pad 5 and the base member 11 can be simultaneously formed when electrically connecting the electrode pads 4a and 4b of the packages 2 to the wiring patterns 13. For this reason, a step for arranging a heat transfer member becomes unnecessary. This makes it possible to reduce the number of manufacturing steps.

The junction pad 5 is provided on the bottom surface of each of the packages 2. It is therefore possible to reliably dissipate the heat generated from the LED chip 3 of each of the packages 2.

The groove portions 14a and 14b whose widths are set in conformity with the arranging positions of the electrode pads 4b and 4a of the packages 2 are provided in the resist layer 14. This makes it possible to prevent the solders from being attached to between the electrode pads 4a and 4b of the adjacent packages 2.

While the invention has been shown and described with respect to the embodiments, the present invention is not limited thereto. It will be understood by those skilled in the art that various changes and modifications may be made without departing from the scope of the invention as defined in the following claims.

What is claimed is:

1. An LED module, comprising:
   a package including electrodes formed on outer surfaces of opposite sidewalls of the package and a light emitting element mounted in the package and connected to the electrodes;
   a base member made of copper-based metal;
   an insulating layer made of an insulating material and stacked on a surface of the base member; and
   an electrically conductive wiring pattern formed on a surface of the insulating layer and soldered to the electrodes,
   wherein the insulating layer includes a through portion formed by partially removing a region of the insulating layer, the packaged being arranged above the through portion, and a heat dissipation member made of a solder is arranged between a bottom surface of the package and the base member, the bottom surface of the package and the base member being opposite to each other through the through portion, and
   wherein the package includes a through-hole having an inner surface plated with metal and one of the electrodes is electrically connected to the light emitting element through the through-hole.

2. The LED module of claim 1,
   wherein a metal-made heat dissipation layer is provided on the bottom surface of the package.

3. The LED module of claim 1,
   wherein the package includes a recess portion formed on an upper surface of the package,
   the light emitting element is arranged within the recess portion, and
   an upper electrode of the light emitting element is electrically connected to said one of the electrodes via the through-hole and a lower electrode of the light emitting element is electrically connected to the other of the electrodes via a conductive pattern formed on the light emitting element.

* * * * *